US008953076B2

(12) United States Patent
Ikeda et al.

(10) Patent No.: US 8,953,076 B2
(45) Date of Patent: *Feb. 10, 2015

(54) PHOTOELECTRIC CONVERSION DEVICE AND CAMERA HAVING A PHOTODIODE CATHODE FORMED BY AN N-TYPE BURIED LAYER

(71) Applicant: Canon Kabushiki Kaisha, Tokyo (JP)

(72) Inventors: Hajime Ikeda, Yokohama (JP); Yoshihisa Kabaya, Yokohama (JP); Takanori Watanabe, Yamato (JP); Takeshi Ichikawa, Hachioji (JP); Mineo Shimotsusa, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/137,100

(22) Filed: Dec. 20, 2013

(65) Prior Publication Data

US 2014/0168492 A1 Jun. 19, 2014

Related U.S. Application Data

(63) Continuation of application No. 13/139,542, filed as application No. PCT/JP2010/050999 on Jan. 20, 2010, now Pat. No. 8,670,059.

(30) Foreign Application Priority Data

Feb. 6, 2009 (JP) .................................. 2009-026698
Dec. 24, 2009 (JP) .................................. 2009-293212

(51) Int. Cl.
*H04N 3/14* (2006.01)
*H04N 5/335* (2011.01)
(Continued)

(52) U.S. Cl.
CPC .. *H01L 31/022408* (2013.01); *H01L 27/14609* (2013.01); *H01L 27/1463* (2013.01); *H01L 27/14643* (2013.01); *H01L 27/14689* (2013.01);
(Continued)

(58) Field of Classification Search
CPC .................. H01L 27/14609; H01L 27/14603; H01L 27/14689; H01L 27/14643; H01L 27/1463; H04N 5/37457; H04N 5/335; H04N 5/3745
USPC .......................... 348/294–324; 250/200–239; 257/225–234
See application file for complete search history.

(56) References Cited

U.S. PATENT DOCUMENTS 5,602,413 A * 2/1997 Morishita ...................... 257/438
5,864,163 A * 1/1999 Chou et al. .................... 257/385

(Continued)

FOREIGN PATENT DOCUMENTS

CN     A 1471311    1/2004
JP     7-38140 A    2/1995

(Continued)

*Primary Examiner* — Chia-Wei A Chen
(74) *Attorney, Agent, or Firm* — Fitzpatrick, Cella, Harper & Scinto

(57) ABSTRACT

A photoelectric conversion device comprises a p-type region, an n-type buried layer formed under the p-type region, an element isolation region, and a channel stop region which covers at least a lower portion of the element isolation region, wherein the p-type region and the buried layer form a photodiode, and a diffusion coefficient of a dominant impurity of the channel stop region is smaller than a diffusion coefficient of a dominant impurity of the buried layer.

8 Claims, 11 Drawing Sheets

(51) Int. Cl.
  *G01J 1/44* (2006.01)
  *H01J 40/14* (2006.01)
  *H01L 27/148* (2006.01)
  *H01L 31/0224* (2006.01)
  *H01L 27/146* (2006.01)

(52) U.S. Cl.
  CPC ...... *H01L 27/14603* (2013.01); *H01L 27/1464* (2013.01); *H04N 5/335* (2013.01)
  USPC ........... 348/302; 348/294; 250/206; 257/225; 257/229

(56) References Cited

U.S. PATENT DOCUMENTS

| | | | |
|---|---|---|---|
| 7,382,009 B2 | 6/2008 | Shinohara | 257/292 |
| 7,687,299 B2 | 3/2010 | Ichikawa | |
| 7,920,192 B2 | 4/2011 | Watanabe et al. | |
| 7,968,922 B2 | 6/2011 | Ichikawa | |
| 8,120,077 B2 | 2/2012 | Katsuno et al. | 257/292 |
| 8,411,187 B2 | 4/2013 | Watanabe et al. | |
| 2005/0035382 A1 | 2/2005 | Shinohara et al. | 257/290 |
| 2006/0076581 A1 | 4/2006 | Oda et al. | |
| 2006/0175538 A1* | 8/2006 | Kim et al. | 250/208.1 |
| 2007/0108371 A1 | 5/2007 | Stevens et al. | |
| 2007/0263105 A1* | 11/2007 | Kano et al. | 348/241 |
| 2008/0099872 A1* | 5/2008 | Tomomatsu et al. | 257/463 |
| 2008/0164500 A1* | 7/2008 | Shinohara et al. | 257/292 |
| 2008/0188028 A1* | 8/2008 | Sekiguchi | 438/59 |
| 2008/0258190 A1* | 10/2008 | Shinohara et al. | 257/292 |
| 2009/0014628 A1* | 1/2009 | Sakano et al. | 250/208.1 |
| 2009/0201400 A1* | 8/2009 | Zhang et al. | 348/296 |
| 2009/0273008 A1* | 11/2009 | Moon | 257/225 |

FOREIGN PATENT DOCUMENTS

| | | |
|---|---|---|
| JP | 2003-258223 A | 9/2003 |
| JP | 2004-39832 A | 2/2004 |
| JP | 2004-103704 A | 4/2004 |
| JP | A 2005-057189 | 3/2005 |
| JP | A 2005-072236 | 3/2005 |
| JP | A 2005-150521 | 6/2005 |
| JP | 2005-286168 A | 10/2005 |
| JP | A 2006-024962 | 1/2006 |
| JP | 2006-108485 A | 4/2006 |
| JP | A 2006-196884 | 7/2006 |
| JP | A 2007-109818 | 4/2007 |
| JP | 2007-201088 A | 8/2007 |
| JP | 2008-41726 A | 2/2008 |
| JP | 2008-66480 A | 3/2008 |
| JP | A 2008-300446 | 12/2008 |

* cited by examiner

A-A'

B-B'

C-C'

PHOTOELECTRIC CONVERSION DEVICE AND CAMERA HAVING A PHOTODIODE CATHODE FORMED BY AN N-TYPE BURIED LAYER

This application is a continuation of application Ser. No. 13/139,542, filed on Jun. 14, 2011 (the U.S. national stage of PCT/JP2010/050999), claims benefit of the filing date of that application under 35 U.S.C. §120, and claims benefit under 35 U.S.C. §119 of Japanese patent applications 2009-026698 and 2009-293212, filed February 6 and Dec. 24, 2009, respectively. The entire contents of each of the mentioned earlier applications are incorporated herein by reference.

BACKGROUND OF THE INVENTION

1. Technical Field

The present invention relates to a photoelectric conversion device, a manufacturing method thereof, and a camera.

2. Background Art

U.S. Patent Application Publication No. 2007/0108371 discloses a PMOS pixel structure in which a p-type buried storage layer is arranged under an n-type pinning layer formed on a surface, and an n-type well is arranged under the p-type buried storage layer. The pinning layer in U.S. Patent Application Publication No. 2007/0108371 is connected to an n-type isolation implant which is spread under and beside an STI (Shallow Trench Isolation) region as an element isolation region. With this structure, holes, which are generated by and stored in the buried storage layer, are transferred to a floating diffusion via a transfer gate and are read out.

In the PMOS pixel structure described in U.S. Patent Application Publication No. 2007/0108371, the cathode of a photodiode is formed by the n-type well. However, the present invention adopts an approach which forms the cathode of a photodiode by an n-type buried layer. Note that a channel stopper region which covers the lower portion of an element isolation region is formed in a shallow region, while the buried layer is formed in a deep region. The channel stopper region has a boundary regulation which largely influences miniaturization, while the buried layer should give a broadly distributed potential barrier. The present invention has been made in consideration of such difference between the channel stopper region and buried layer.

DISCLOSURE OF INVENTION

The present invention provides a photoelectric conversion device having a novel structure in which the cathode of a photodiode is formed by an n-type buried layer.

One of the aspect of the present invention provides a photoelectric conversion device comprising a p-type region, an n-type buried layer formed under the p-type region, an element isolation region, and a channel stop region which covers at least a lower portion of the element isolation region, wherein the p-type region and the buried layer form a photodiode, and a diffusion coefficient of a dominant impurity of the channel stop region is smaller than a diffusion coefficient of a dominant impurity of the buried layer.

Further features of the present invention will become apparent from the following description of exemplary embodiments (with reference to the attached drawings).

BEST MODE FOR CARRYING OUT THE INVENTION

Embodiments of the present invention will be described hereinafter with reference to the accompanying drawings.

Figure 1:
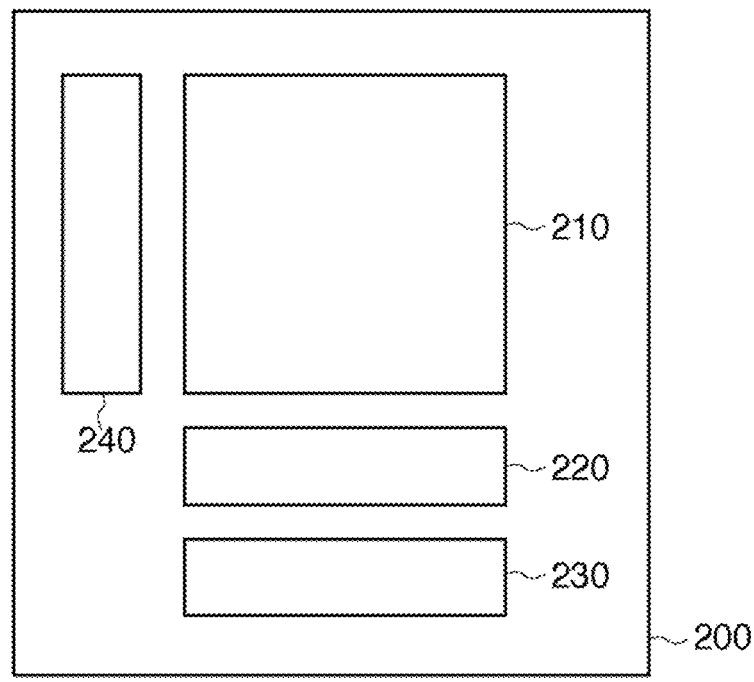
FIG. 1 is a schematic view showing the arrangement of an image sensing device according to an embodiment of the present invention.

FIG. 1 is a schematic view showing the arrangement of an image sensing device 200 according to an embodiment of the present invention. The image sensing device 200 is formed on a semiconductor substrate, and can be called, for example, a solid-state image sensor, MOS image sensor, CMOS sensor, or the like. The image sensing device 200 is one mode of a photoelectric conversion device according to the present invention, and the photoelectric conversion device according to the present invention includes, for example, a linear sensor and light quantity sensor in addition to an image sensor.

The image sensing device 200 according to the embodiment of the present invention includes a pixel array 210 in which pixels are two-dimensionally arranged to form a plurality of rows and a plurality of columns The image sensing device 200 can also include a row selecting circuit 240 which selects a row in the pixel array 210, a column selecting circuit 230 which selects a column in the pixel array 210, and a readout circuit 220 which reads out a signal of the column selected by the column selecting circuit 230 in the pixel array 210. The row selecting circuit 240 and column selecting circuit 230 can include, for example, shift registers, but they may also be configured to randomly access rows and columns.

Figure 2:
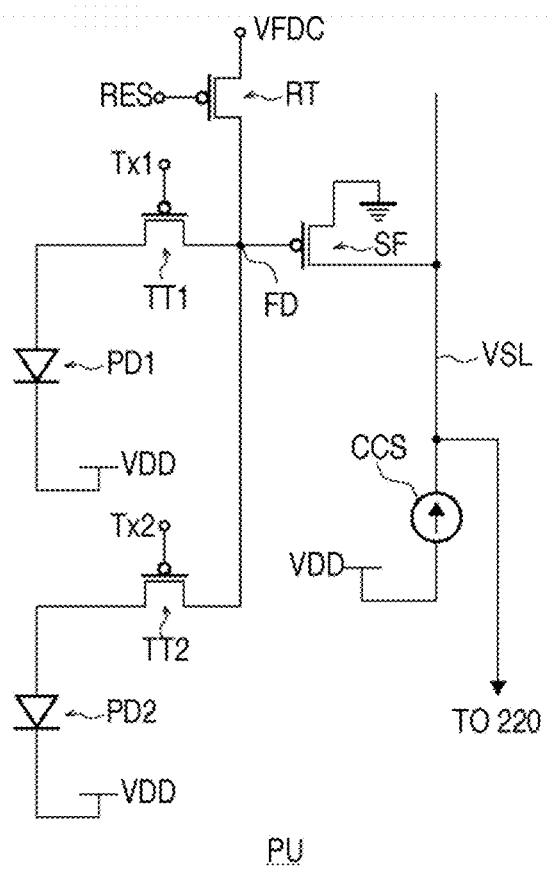
FIG. 2 is a circuit diagram showing an example of the arrangement of a pixel unit of a pixel array.

FIG. 2 is a circuit diagram showing an example of the arrangement of a pixel unit PU in the pixel array 210. In this arrangement example, the pixel unit PU includes two pixels. However, the pixel unit PU may form a single pixel or may include three or more pixels as other embodiments. The pixel unit PU is configured to read out a hole of an electron and hole generated by photoelectric conversion as a signal. The pixel array 210 is formed by two-dimensionally laying out pixel units PU each including at least one pixel.

In the arrangement example shown in FIG. 2, the pixel unit PU can include two photodiodes PD1 and PD2, two transfer transistors TT1 and TT2, one amplifier transistor SF, and one reset transistor RT. The amplifier transistor SF and reset transistor RT are shared by the photodiodes PD1 and PD2 and the transfer transistors TT1 and TT2. Each of the transfer transistor TT (TT1, TT2), amplifier transistor SF, and reset transistor RT is formed as a PMOS transistor.

The transfer transistors TT1 and TT2 are enabled when an active pulse (low pulse) is applied to transfer signal lines Tx1 and Tx2 connected to their gates. Then, holes stored in storage regions (p-type regions) of the photodiodes PD1 and PD2 are transferred to a floating diffusion FD. Note that the photodiodes PD1 and PD2 are arranged to form different rows, and an active pulse is applied to the transfer signal lines Tx1 and Tx2 at different timings.

The amplifier transistor SF forms a source-follower circuit together with a constant current source CCS which supplies a constant current to a vertical signal line (column signal line) VSL. The amplifier transistor SF amplifies, by a source-follower operation, a signal (potential change) which appears in the floating diffusion FD as a result of transfer of a hole to the floating diffusion FD via the transfer transistor TT, and outputs the amplified signal onto the vertical signal line VSL. The signal output onto the vertical signal line VSL is read out by the readout circuit 220. The reset transistor RT is enabled to reset the floating diffusion FD when an active pulse (low pulse) is applied to a reset signal line RES connected to its gate.

In the arrangement example shown in FIG. 2, a row is selected by controlling a potential VFDC applied to the drain electrode of the reset transistor RT. A row in which the potential of the floating diffusion FD is reset to a potential that does not enable the amplifier transistor SF is set in a non-selecting state. On the other hand, a row in which the potential of the floating diffusion FD is reset to a potential that enables the amplifier transistor SF is set in a selecting state. As another embodiment, a selecting transistor used to select a row may be arranged in series with the amplifier transistor SF between the ground potential and the vertical signal line VSL. The selecting transistor may be arranged, for example, between the ground potential and the amplifier transistor SF or between the amplifier transistor SF and the vertical signal line VSL.

Figure 3:
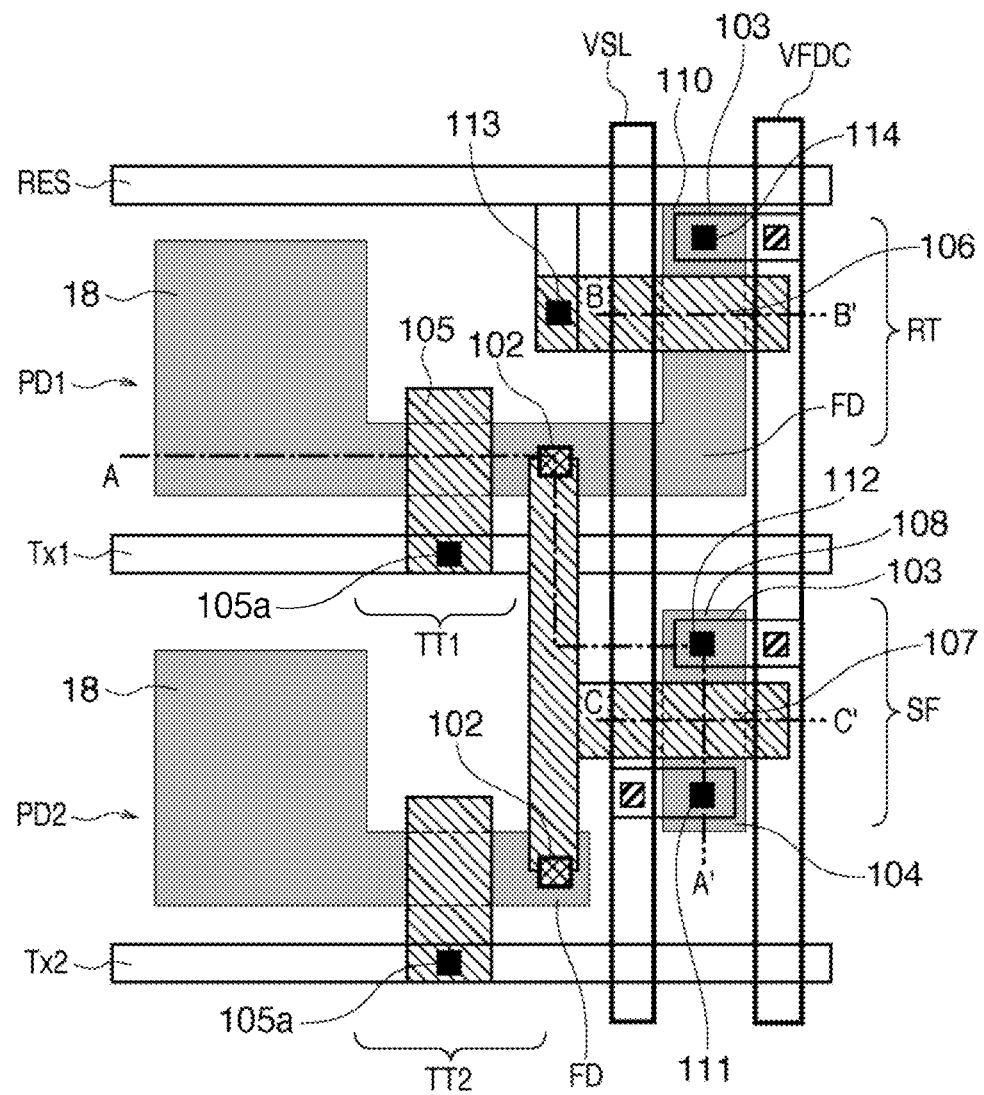
FIG. 3 is a layout view showing an example of the arrangement of the pixel unit which forms the pixel array.
Figure 4:
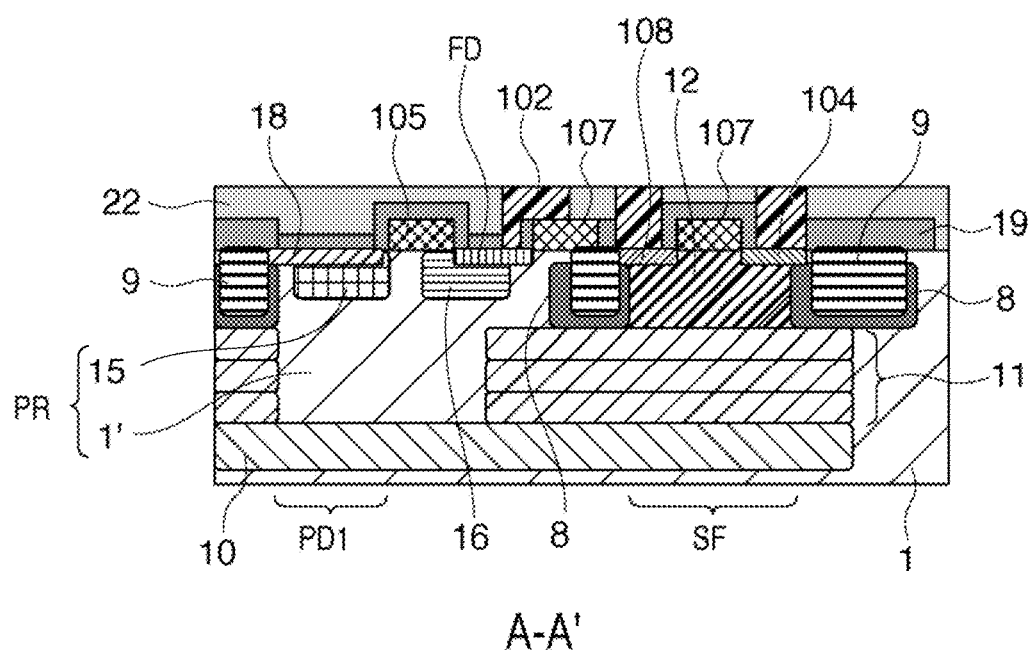
FIG. 4 is a sectional view taken along a line A-A' in FIG. 3.
Figure 5:
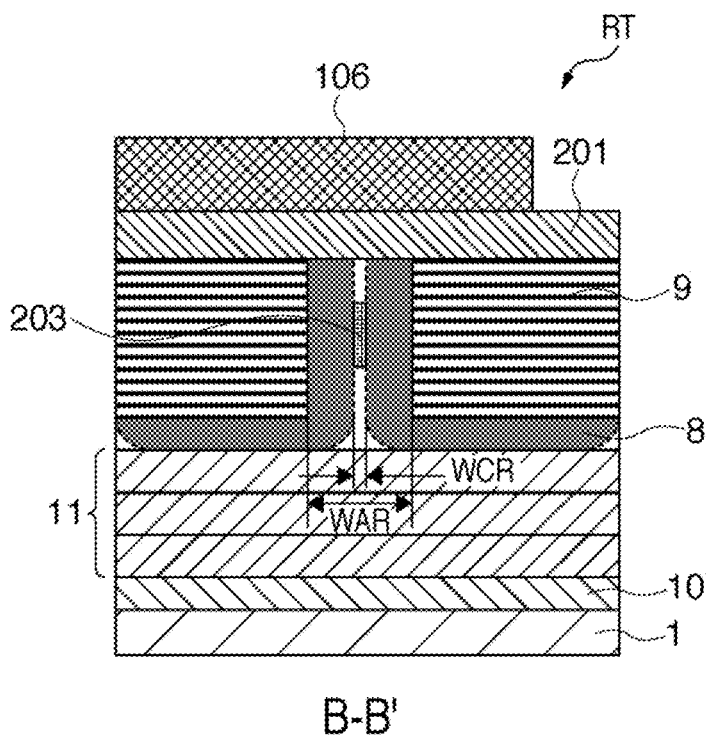
FIG. 5 is a sectional view taken along a line B-B' in FIG. 3.
Figure 6:
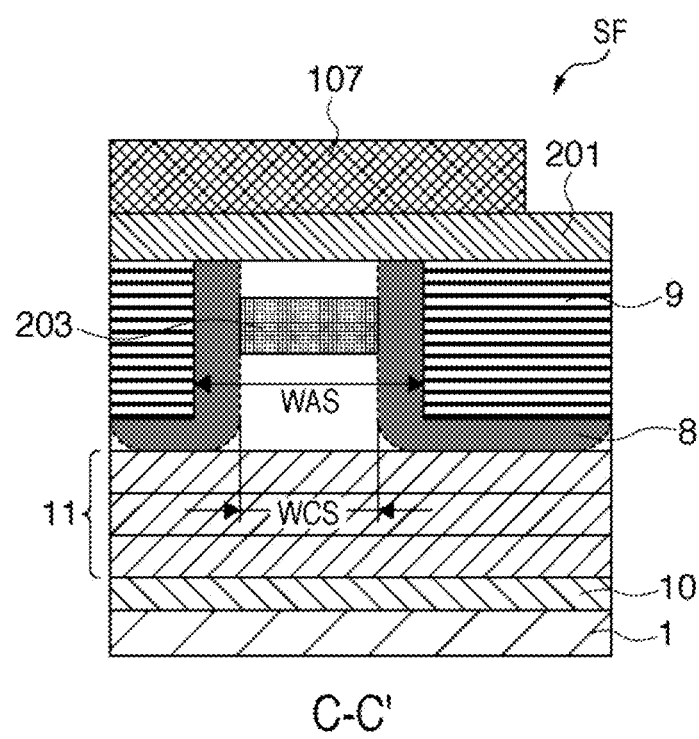
FIG. 6 is a sectional view taken along a line C-C' in FIG. 3.

FIG. 3 is a layout view showing an example of the arrangement of the pixel unit PU which forms the pixel array 210. FIG. 4 is a sectional view taken along a line A-A' in FIG. 3. FIG. 5 is a sectional view taken along a line B-B' in FIG. 3. FIG. 6 is a sectional view taken along a line C-C' in FIG. 3.

In this embodiment, the photodiode PD (PD1, PD2) is formed by a p-type region PR and an n-type buried layer 10 formed under the p-type region PR. The p-type region PR serves as the anode, and the buried layer 10 serves as the cathode. The p-type region PR includes a p-type first region 15 and a p-type second region 1', at least a portion of which is arranged between the first region 15 and the n-type buried layer 10. The first region 15 serves as a principal charge storage region. A p-type impurity concentration of the second region 1' can be the same as, for example, that of a p-type silicon substrate (semiconductor substrate) 1. A p-type impurity concentration of the first region 15 is higher than that of the second region 1'. The p-type region PR is preferably formed under an n-type surface region 18. In this case, the buried photodiode PD is formed by the n-type surface region 18, p-type region PR, and n-type buried layer 10. It is known that the buried photodiode suffers less noise generated by a dark current.

The diffusion coefficient of a dominant impurity of the n-type surface region 18 is preferably smaller than that of a dominant impurity of the buried layer 10. For example, it is preferable that the dominant impurity of the n-type surface region 18 is arsenic (As) and that of the buried layer 10 is phosphorus (P). Since the diffusion coefficient of arsenic (As) is smaller than that of phosphorus (P), forming the surface region 18 using arsenic (As) is advantageous for miniaturization since it is easy to settle its boundary. On the other hand, since it is easy to make phosphorus (P) enter to a deeper position of the semiconductor substrate than arsenic (As), forming the buried layer 10 using phosphorus (P) is to allow to form the buried layer 10 in the deeper position, and is advantageous for sensitivity enhancement. Since the diffusion coefficient of phosphorus (P) is larger than that of arsenic (As), forming the buried layer 10 using phosphorus (P) is advantageous in formation of a broadly distributed potential barrier. Since the ion radius of phosphorus (P) is larger than the lattice constant of the silicon substrate 1, the lattices of the silicon substrate 1 are distorted by implanting phosphorus (P) into the silicon substrate 1, thus advantageously causing a gettering effect of an impurity metal element. This contributes to improvement of point defects. The buried layer 10 can be formed by ion-implanting phosphorus (P) into the semiconductor substrate 1 using a channeling phenomenon. In the present invention, impurities to be implanted or doped are not limited to arsenic (As) and phosphorus (P), and other impurities may be used.

The floating diffusion FD is a p-type third region. On a region between the p-type first region 15, which forms a portion of the photodiode PD, and the floating diffusion FD (p-type third region), a gate 105 of the transfer transistor TT (TT1, TT2) is arranged. In other words, the transfer transistor TT is formed by the p-type first region 15, floating diffusion FD (p-type third region), and gate 105. The transfer transistor TT transfers holes stored in the p-type regions (regions 15 and 1') of the photodiode PD to the floating diffusion FD. In this embodiment, the transfer transistor TT is a PMOS transistor. The gate 105 of the transfer transistor TT can be formed by polysilicon.

The p-type second region 1' can be arranged to surround the p-type first region 15 in a section. The element isolation region side of the p-type first region 15 may contact a channel stop region (to be described later). In this case, the p-type second region 1' surrounds the p-type first region 15 except for the element isolation region side of the p-type first region 15. The second region 1' and the floating diffusion FD (third region) are isolated by an n-type region 16, and the channel of the transfer transistor TT is formed in the n-type region 16.

Element isolation regions 9 are arranged to isolate active regions where the photodiode PD, transfer transistor TT, amplifier transistor SF, and reset transistor RT are to be formed. The active regions correspond to the surface region 18, the floating diffusion FD, and diffusion regions 104, 108, and 110 in FIG. 3, and regions other than those can be the element isolation regions 9. Formation of the element isolation regions 9 can typically use an STI (Shallow Trench Isolation) technique or LOCOS (Local Oxidation Of Silicon) technique. Alternatively, diffusion isolation may be used.

Channel stop regions 8 are formed in regions that cover at least lower portions (lower side surfaces and bottom surfaces) of the element isolation regions 9. The diffusion coefficient of a dominant impurity of each channel stop region 8 is preferably smaller than that of a dominant impurity of the buried layer 10. For example, it is preferable that the dominant impurity of the channel stop region 8 is arsenic (As), and that of the buried layer 10 is phosphorus (P). As described above, since the diffusion coefficient of arsenic (As) is smaller than that of phosphorus (P), forming the channel stop regions 8 using arsenic (As) is advantageous for miniaturization. The dominant impurity of the channel stop region 8 can be the same as that of the surface region 18.

A potential bather 11 is formed between the photodiodes PD. The potential barriers 11 can also be formed between the photodiodes PD, amplifier transistor SF, and reset transistor RT, as needed. In a photoelectric conversion device of a single pixel or an image sensing device having a large inter-pixel interval, a potential barrier between the photodiodes is not required. When the element isolation regions 9 are formed to sufficiently deep positions, potential barriers between the photodiodes PD, amplifier transistor SF, and reset transistor RT are not required. In this embodiment, formation of the potential barrier 11 settles the p-type region 1' surrounded by the potential barrier 11.

A gate 107 of the amplifier transistor SF is electrically connected to the floating diffusion FD. The gate 107 of the amplifier transistor SF can be formed by polysilicon. In this embodiment, the gate 107 of the amplifier transistor SF is electrically connected to the floating diffusion FD via a contact plug 102. Note that the contact plug 102 is preferably a shared contact plug in terms of improvement of an aperture ratio or pixel density. The shared contact plug is a contact plug which electrically connects the diffusion region (source or drain) of one transistor to the gate of the other transistor via one contact plug. Note that the gate 107 of the amplifier transistor SF may be connected via one contact plug which is electrically connected to the gate 107, another contact plug which is electrically connected to the floating diffusion FD, and at least one conductive pattern.

The amplifier transistor SF is a PMOS transistor containing the gate 107 which is electrically connected to the floating diffusion FD, and the diffusion regions 104 and 108. The reset transistor RT is a PMOS transistor containing the gate 106 which is connected to the reset signal line RES, the floating diffusion FD, and the diffusion region 110. The gate of the reset transistor RT can be formed by polysilicon.

The amplifier transistor SF preferably has a buried channel structure. This is because the amplifier transistor SF having the buried channel structure can reduce 1/f noise (1/f noise is inversely proportional to the product of a channel width and channel length). On the other hand, the reset transistor RT and transfer transistor TT (and a selecting transistor used to select a row when such row selecting transistor is included) (especially, the reset transistor RT) preferably have a surface channel structure. This is because an OFF state of a transistor is important to suppress leakage of holes to the floating diffusion FD. A buried channel type transistor is readily set in a normally ON state, and is difficult to be set in an OFF state. In order to miniaturize a pixel, it is effective to miniaturize the reset transistor RT and transfer transistor TT (and a selecting transistor used to select a row when such row selecting transistor is included), and the surface channel type is advantageous for this purpose.

Preferred structures of the reset transistor RT and amplifier transistor SF will be examined below with reference to FIGS. 5 and 6. Referring to FIG. 5, reference symbol WAR denotes an interval between the element isolation regions 9 in the channel width direction of the reset transistor RT; and WCR, a channel width of the reset transistor RT. When no channel stop region 8 exists, the interval WAR and the channel width WCR match. However, due to the existence of the channel stop regions 8, the channel width WCR becomes smaller than the interval WAR. Referring to FIG. 6, reference symbol WAS denotes an interval between the element isolation regions 9 in the channel width direction of the amplifier transistor SF; and WCS, a channel width of the amplifier transistor SF. When no channel stop region 8 exists, the interval WAS and the channel width WCS match. However, due to the existence of the channel stop regions 8, the channel width WCS becomes smaller than the interval WAS. In this specification, the channel width means a dimension in consideration of the channel stop regions. Note that in FIGS. 5 and 6, reference numeral 201 denotes a gate insulating film.

In order to form the amplifier transistor SF to have the buried channel structure and the reset transistor RT to have the surface channel structure, the channel width WCS of the amplifier transistor SF is preferably larger than the channel width WCR of the reset transistor RT. As a method of implementing the buried channel structure, a method of executing channel doping at a predetermined depth position from an interface between a gate insulating film and substrate is available. An impurity to be channel-doped has the same conductivity type as that of a source-drain region, and its concentration is set to be lower than the source-drain region. When the channel width is small, the width of a region to be channel-doped becomes small. Furthermore, since the conductivity type of an impurity of each channel stop region 8 is a conductivity type opposite to that of the channel-doped region, the impurity of the channel stop region 8 may be diffused into a region to be channel-doped. In such case, the impurity concentration of the channel-doped region lowers, and the buried channel structure is hardly formed.

That is, in order to realize the amplifier transistor SF having the buried channel structure and the reset transistor RT having the surface channel transistor SF, the channel width WCS of the amplifier transistor SF is preferably larger than the channel width WCR of the reset transistor RT. Note that the channel width WCS of the amplifier transistor SF is preferably larger than 1 µm, and the channel width WCR of the reset transistor RT is preferably smaller than 0.1 µm. This channel width is that of a region where a threshold remains unchanged in the amplifier transistor, and is that of a region where a threshold begins to rise in the reset transistor.

A method of manufacturing the image sensing device 200 according to a preferred embodiment of the present invention will be exemplified below with reference to FIGS. 7A to 7D, 8A to 8C, 9A to 9C, 10A, 10B, 11A, and 11B. In a process shown in FIG. 7A, a p-type silicon substrate 1 is prepared. A silicon oxide film having a thickness of 10 to 200 Å is formed on the surface of the silicon substrate 1. After that, a polysilicon film having a thickness of 400 to 600 Å and a silicon nitride film having a thickness of 150 to 200 Å are formed in turn, and these films are patterned to form a mask.

Figure 7A:
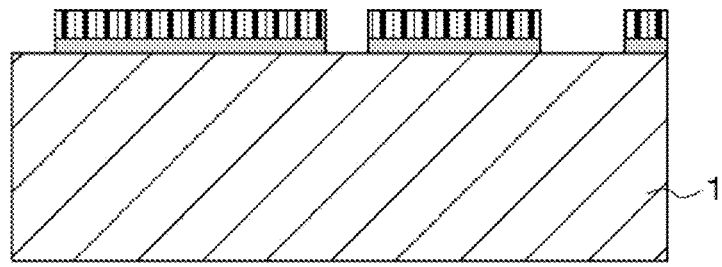
FIGS. 7A to 7D are views for explaining an example of a method of manufacturing an image sensing device according to an embodiment of the present invention.
Figure 7B:
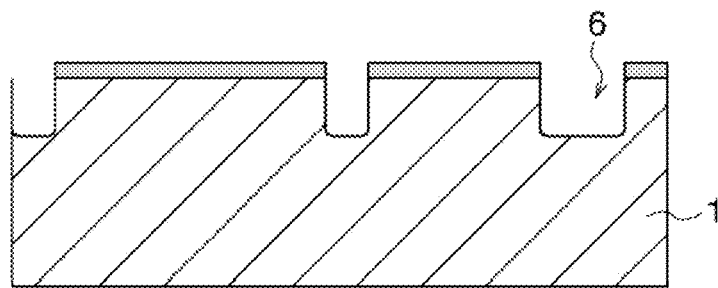
Figure 7C:
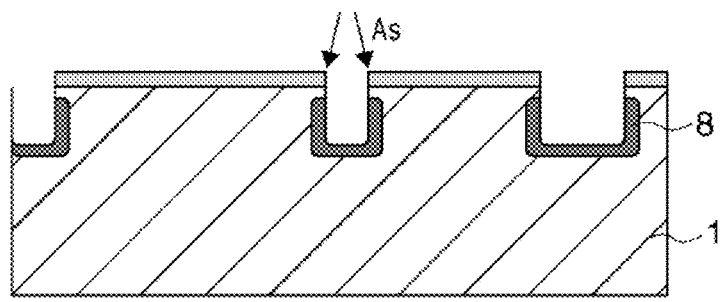
Figure 7D:
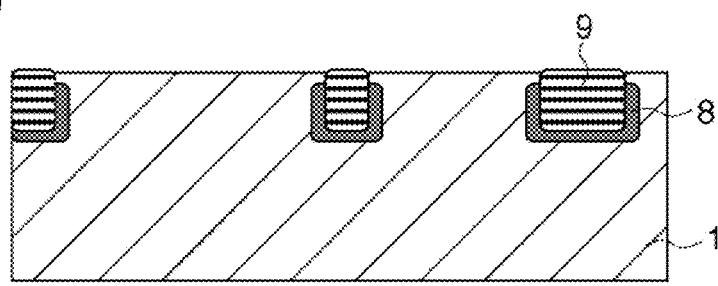

In a process shown in FIG. 7B, opening portions of the mask formed in the process shown in FIG. 7A are etched to form trenches 6 to form the element isolation regions 9. In a process shown in FIG. 7C, arsenic (As) is implanted in the bottom portions and lower side portions of the trenches 6 at 150 to 200 KeV to form channel stop regions 8. In a process shown in FIG. 7D, element isolation regions (STI) 9 are formed in the trenches 6.

Figure 8A:
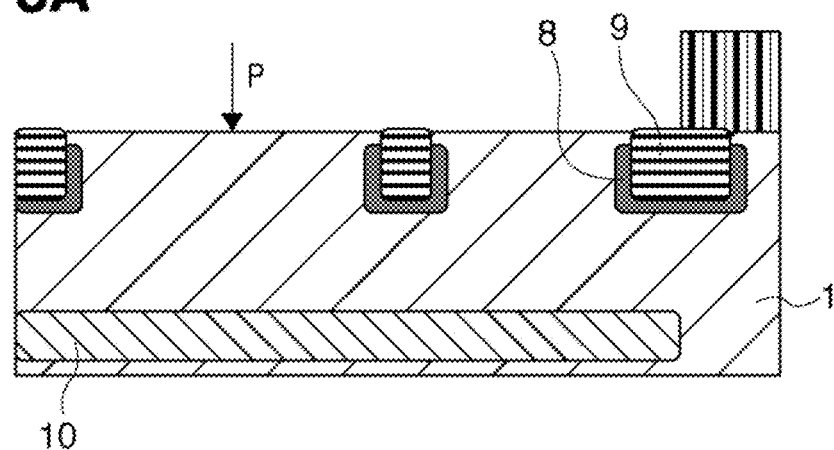
FIGS. 8A to 8C are views for explaining an example of the method of manufacturing an image sensing device according to the embodiment of the present invention.
Figure 8B:
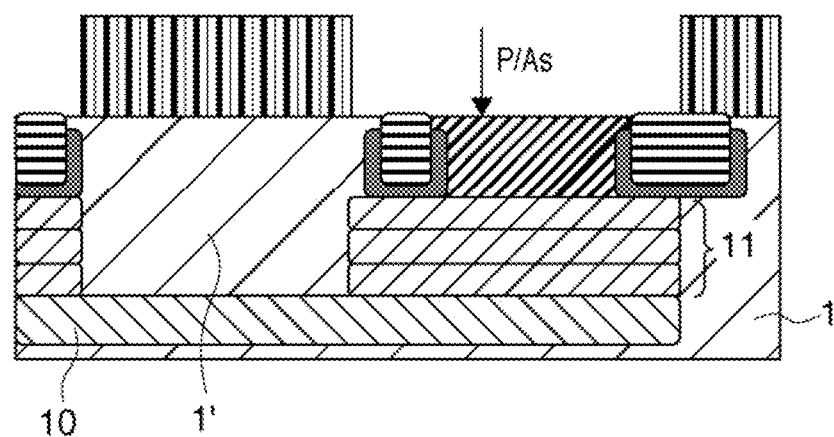

In a process shown in FIG. 8A, phosphorus (P) is implanted in a deep portion of the p-type silicon substrate 1 at 4,000 to 8,000 KeV to form an n-type buried layer 10. In this case, it is preferable to implant phosphorus (P) in a deep portion as much as possible using the channeling phenomenon. In a process shown in FIG. 8B, potential bathers 11 are formed between photodiodes PD, and between the photodiodes PD, an amplifier transistor SF, and a reset transistor RT, as needed. The potential barriers 11 can be formed by implanting, for example, phosphorus (P) in the silicon substrate 1 at 2,000 to 2,500 KeV, then implanting phosphorus (P) at 1,000 to 1,500 KeV, and also implanting arsenic (As) at 700 to 750 KeV.

Figure 8C:
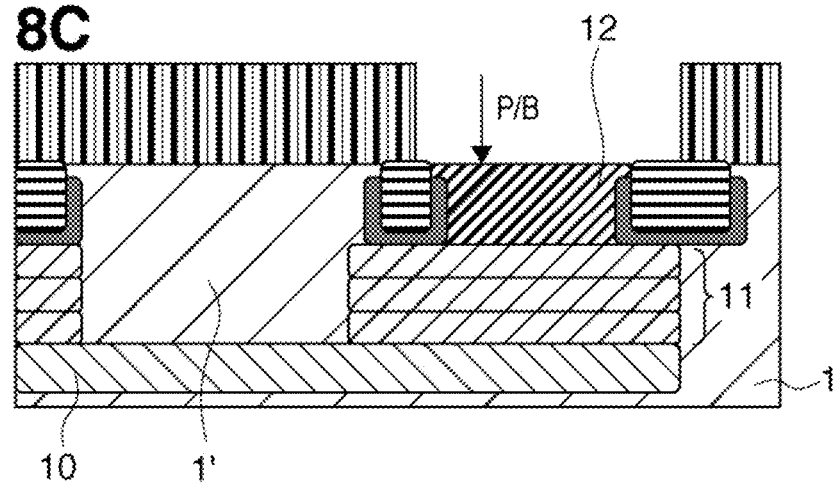

In a process shown in FIG. 8C, ions are implanted in prospective formation regions of the amplifier transistor SF and reset transistor RT to form target potential structures. For example, this ion implantation process includes, for example, channel doping. As described above, it is preferable to form the potential structures so that the amplifier transistor SF has a buried channel structure, and the reset transistor RT has a surface channel structure.

Figure 9A:
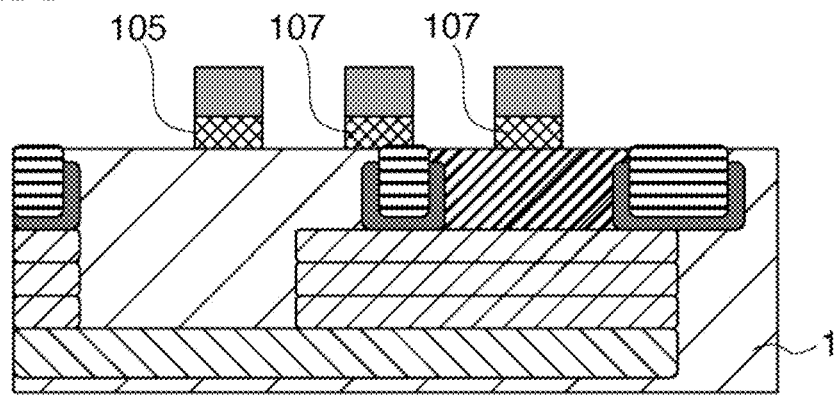
FIGS. 9A to 9C are views for explaining an example of the method of manufacturing an image sensing device according to the embodiment of the present invention.
Figure 9B:
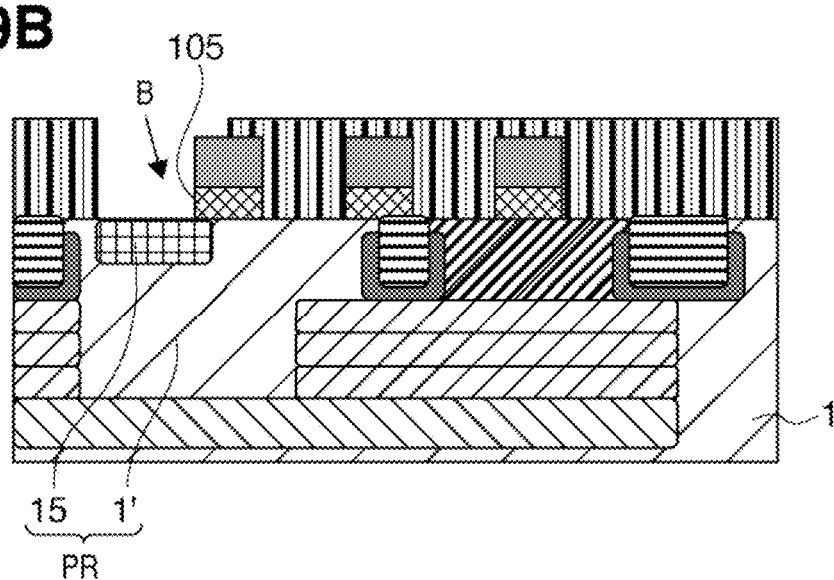
Figure 9C:
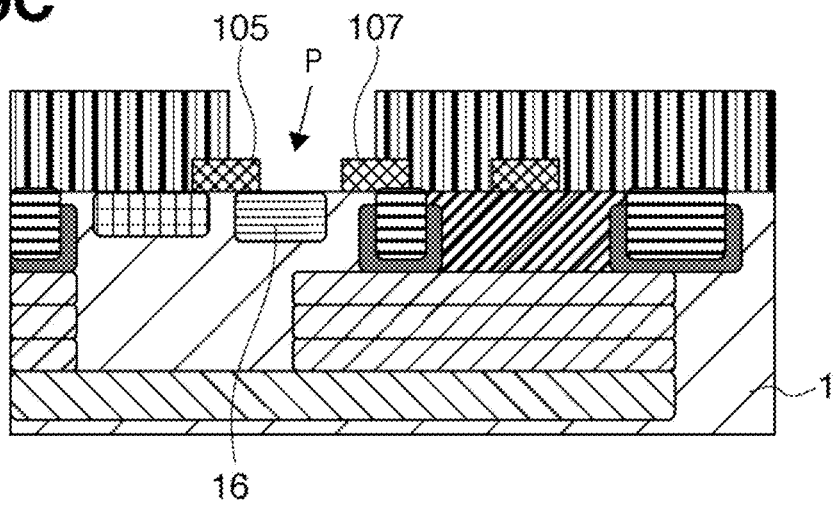

In a process shown in FIG. 9A, a gate oxide film and polysilicon electrodes are formed, and are patterned to form gates 105 and 107 (and 106 (not shown)). In a process shown in FIG. 9B, boron (B) is implanted in a region of the photodiode PD at 50 to 150 KeV to form a first region 15 which forms a portion of a p-type region PR. In a process shown in FIG. 9C, phosphorus (P) is implanted in a region which extends from a portion below the transfer transistor TT toward the floating diffusion FD side at 50 to 150 KeV to form an n-type region 16.

Figure 10A:
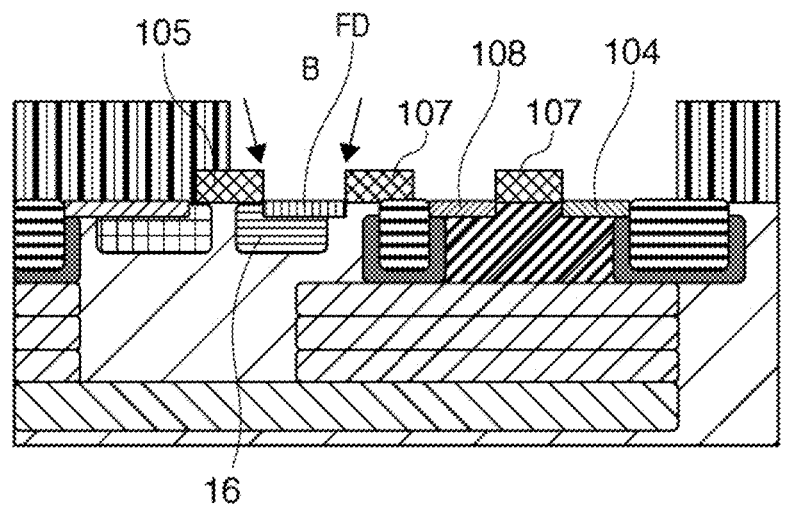
FIGS. 10A and 10B are views for explaining an example of the method of manufacturing an image sensing device according to the embodiment of the present invention.
Figure 10B:
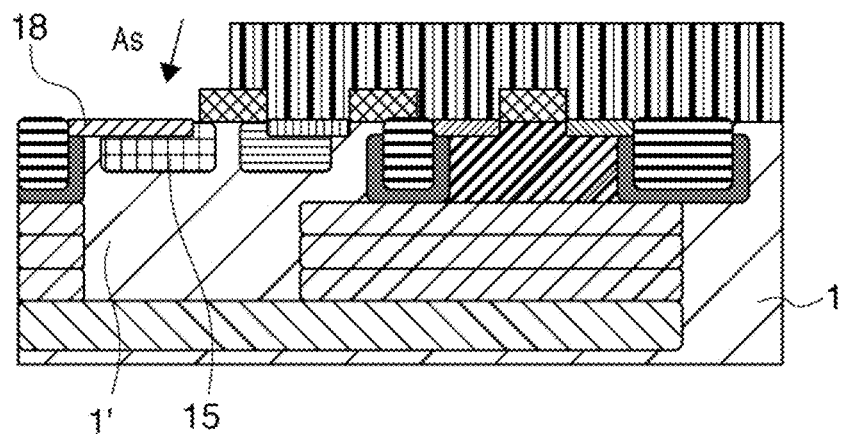

In a process shown in FIG. 10A, boron (B) is implanted in prospective formation regions of diffusion regions of a PMOS transistor at 10 to 15 KeV to form a floating diffusion FD, and diffusion regions 108 and 104 (and 110 (not shown)). Also, source and drain regions of other transistors are formed. In a process shown in FIG. 10B, arsenic (As) is implanted in a prospective formation region of a surface region 18 at 50 to 100 KeV to form the surface region 18.

Figure 11A:
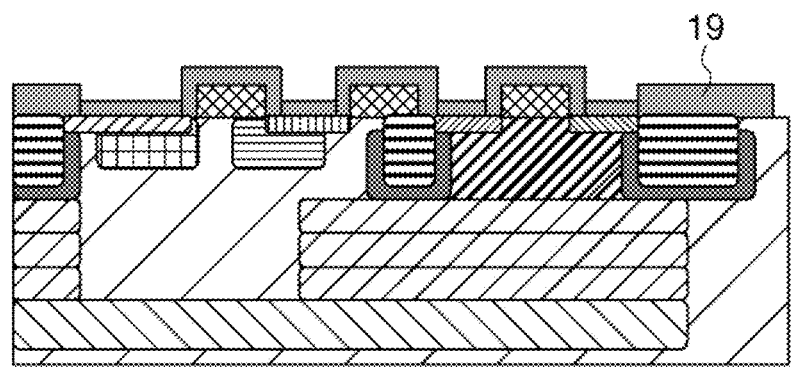
FIGS. 11A and 11B are views for explaining an example of the method of manufacturing an image sensing device according to the embodiment of the present invention.
Figure 11B:
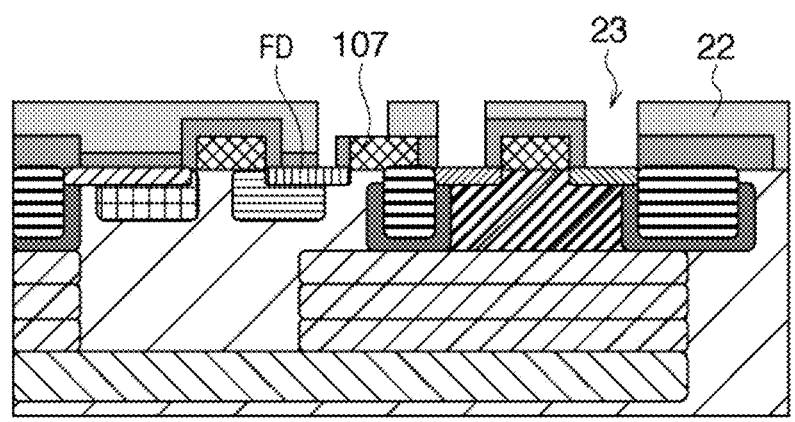

In a process shown in FIG. 11A, a film 19 including a silicon oxide film having a thickness of 50 to 100 Å, an anti-reflection silicon nitride film having a thickness of 400 to 600 Å, and a protective silicon oxide film having a thickness of 500 to 1,000 Å is formed. In a process shown in FIG. 11B, an interlayer dielectric film (e.g., an NSG having a thickness of 500 to 1,500 Å and BPSG having a thickness of 10,000 to 15,000 Å) 22 is formed, and a contact hole 23 is formed in the interlayer dielectric film 22.

A barrier metal (Ti/TiN) is formed in the contact hole 23, and tungsten (W) is filled to form a contact plug 102 (and 105a and 111 to 113 (not shown)), thus reaching the structure shown in FIG. 4.

In place of the aforementioned method, the image sensing device 200 can also be manufactured by the following manufacturing method. A buried layer 10 is formed on the surface of a p-type silicon substrate. A p-type semiconductor layer is expitaxially grown on the buried layer 10. Element isolation regions 9 and channel stop regions 8 are formed on the semiconductor layer by the processes shown in FIGS. 7A to 7D. In this manner, a structure shown in FIG. 8A is obtained, and the image sensing device 200 can be manufactured by the subsequent processes according to this embodiment.

Figure 13:
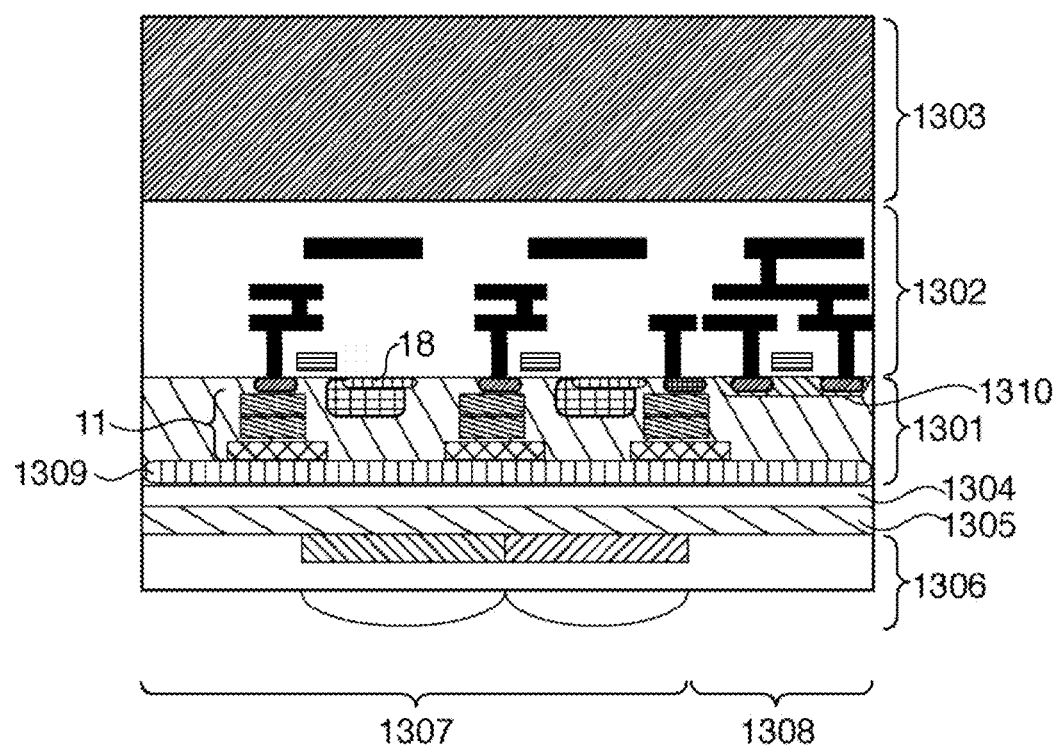
FIG. 13 is a view for explaining an example of a method of manufacturing an image sensing device according to another embodiment of the present invention.

FIG. 13 shows the sectional structure of an image sensing device (or photoelectric conversion device) according to another embodiment of the present invention. FIG. 13 illustrates one transistor portion which forms a photodiode, floating diffusion, and peripheral circuit. The same reference numerals denote portions having the same functions as in the structure of the aforementioned embodiment, and a detailed description thereof will not be repeated. A difference of the embodiment shown in FIG. 13 from the aforementioned embodiment lies in a direction of incidence of light. In the embodiment shown in FIG. 13, a back-side illumination structure which receives light from the lower direction in FIG. 13 (i.e., a side opposite to a side where interconnection layers are formed) is adopted.

A photoelectric conversion unit, semiconductor regions of transistors, and the like are formed on a semiconductor substrate 1301. An interconnection layer 1302 is arranged on the first principal surface side (obverse surface side) of the semiconductor substrate 1301. A support substrate 1303 is arranged on the upper portion of the interconnection layer 1302, that is, on the side opposite to the substrate 1301 when viewed from the interconnection layer 1302, for the purpose of mainly assuring a high mechanical strength of the image sensing device. An optical function unit 1306 is arranged as needed via an oxide film 1304 and protective film 1305 on the second principal surface side (back surface side) of the semiconductor substrate 1301, that is, on the side opposite to the interconnection layer 1302 when viewed from the semiconductor substrate 1301. The optical function unit 1306 can include, for example, color filters, microlenses, and a planarized layer. In this manner, the image sensing device according to the embodiment shown in FIG. 13 has the back-side illumination structure which receives light from the side opposite to the formation side of the interconnection layer, that is, the back side.

FIG. 13 illustrates a pixel region 1307 and peripheral circuit region 1308. The pixel region 1307 is a region corresponding to a pixel array 210. On the pixel region 1307, a plurality of photoelectric conversion units are arranged. On the peripheral circuit region 1308, a well 1310 for a peripheral circuit transistor is arranged. The peripheral circuit region 1308 includes a readout circuit 220, column selecting circuit 230, and row selecting circuit 240.

On an interface of the second principal surface side (back surface side) of the semiconductor substrate 1301, an $n^+$-type semiconductor region 1309 is arranged. The $n^+$-type semiconductor region 1309 is a region corresponding to a buried layer 10. The $n^+$-type semiconductor region 1309 can also serve as a layer used to suppress a dark current at an interface of the oxide film 1304. That is, in case of the back-side illumination type, a dark current suppression layer is formed on the first and second principal surfaces. In FIG. 13, the $n^+$-type semiconductor region 1309 is arranged on the entire surface of the semiconductor substrate 1301, but it may be arranged only on the pixel region 1308.

The diffusion coefficient of a dominant impurity of an n-type surface region 18 is preferably smaller than that of a dominant impurity of the $n^+$-type semiconductor region 1309 as the buried layer. For example, the dominant impurity of the n-type surface region 18 is preferably arsenic (As), and that of the $n^+$-type semiconductor region 1309 is preferably phosphorus (P). Since the diffusion coefficient of arsenic (As) is smaller than that of phosphorus (P), forming the surface region 18 using arsenic (As) is advantageous for miniaturization since it is easy to settle its boundary. On the other hand, since it is easy to make phosphorus (P) enter to a deeper position of the semiconductor substrate than arsenic (As), forming the $n^+$-type semiconductor layer 1309 using phosphorus (P) is to allow to form the $n^+$-type semiconductor layer 1309 in the deeper position, and is advantageous for sensitivity enhancement. Since the diffusion coefficient of phosphorus (P) is larger than that of arsenic (As), forming the $n^+$-type semiconductor layer 1309 using phosphorus (P) is advantageous in formation of a broadly distributed potential barrier. Since the ion radius of phosphorus (P) is larger than the lattice constant of the semiconductor substrate 1301, the lattices of the semiconductor substrate 1301 are distorted by implanting phosphorus (P) into the semiconductor substrate 1301, thus advantageously causing a gettering effect of an impurity metal element. This contributes to improvement of point defects. The $n^+$-type semiconductor layer 1309 can be formed by ion-implanting phosphorus (P) into the semiconductor substrate 1301 using a channeling phenomenon. In the present invention, impurities to be implanted or doped are not limited to arsenic (As) and phosphorus (P), and other impurities may be used.

Figure 12:
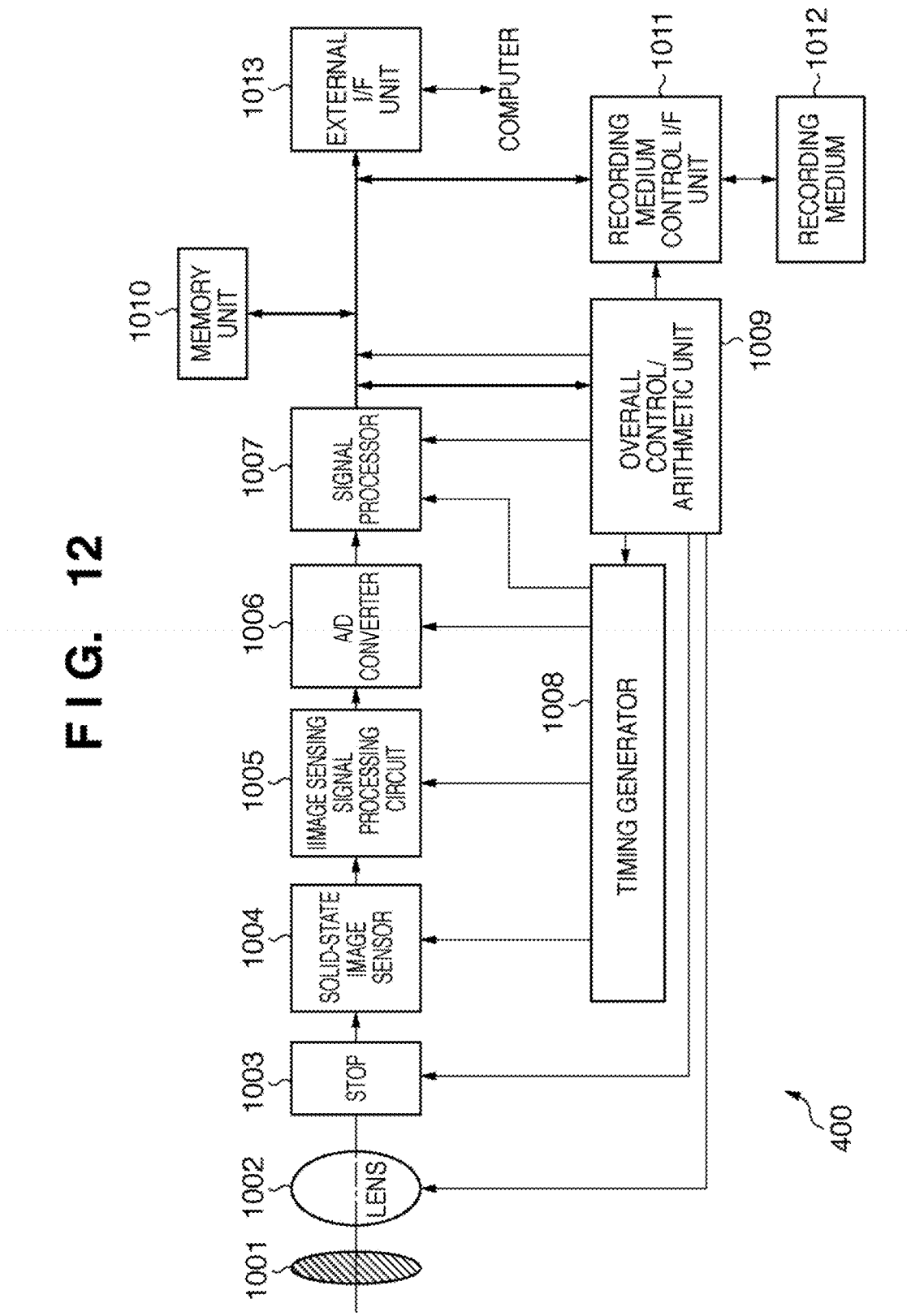
FIG. 12 is a schematic block diagram showing the arrangement of a camera according to an embodiment of the present invention.

FIG. 12 is a schematic block diagram showing the arrangement of a camera according to an embodiment of the present invention. Note that the concept of a camera includes not only an apparatus primarily intended to photographing but also an apparatus which secondarily includes a photographing function (for example, a personal computer or portable terminal). A camera 400 includes a solid-state image sensor 1004 represented by the aforementioned image sensing device 200. An optical image of an object is formed on an image sensing surface of the solid-state image sensor 1004 via a lens 1002. On the outer side of the lens 1002, a barrier 1001 which serves as a protection function of the lens 1002 and a main switch is arranged. A stop 1003 used to adjust the amount of light that emerges from the lens 1002 may be arranged for the lens 1002. An image sensing signal output from the solid-state image sensor 1004 undergoes processing such as various kinds of correction and clamping by an image sensing signal processing circuit 1005. The image sensing signal output from the image sensing signal processing circuit 1005 is analog-to-digital converted by an A/D converter 1006. Image data output from the A/D converter 1006 undergoes signal processing such as correction and data compression by a signal processor 1007. The solid-state image sensor 1004, image sensing signal processing circuit 1005, A/D converter 1006, and signal processor 1007 operate according to timing signals generated by a timing generator 1008.

The blocks 1005 to 1008 may be formed on the same chip as the solid-state image sensor 1004. The respective blocks of the camera 400 are controlled by an overall control/arithmetic unit 1009. The camera 400 also includes a memory unit 1010 used to temporarily store image data, and a recording medium control interface unit 1011 used to record or read out an image in or from a recording medium. A recording medium 1012 includes, for example, a semiconductor memory, and is detachable. The camera 400 may include an external interface (I/F) unit 1013 required to communicate with, for example, an external computer.

The operation of the camera 400 shown in FIG. 12 will be described below. In response to an opening action of the barrier 1001, a main power supply, a power supply of a control system, and that of image sensing system circuits including the A/D converter 1006 are turned on in turn. The overall control/arithmetic unit 1009 sets the stop 1003 to have a full aperture value in order to control an exposure amount. A signal output from the solid-state image sensor 1004 is supplied to the A/D converter 1006 through the image sensing signal processing circuit 1005. The A/D converter 1006 A/D-converts that signal, and outputs digital data to the signal processor 1007. The signal processor 1007 processes that data and provides the processed data to the overall control/arithmetic unit 1009, which executes arithmetic operations required to decide an exposure amount. The overall control/arithmetic unit 1009 controls the stop based on the decided exposure amount.

Next, the overall control/arithmetic unit 1009 extracts high-frequency components from the signal, which is output from the solid-state image sensor 1004 and is processed by the signal processor 1007, and calculates a distance to the object based on the high-frequency components. After that, the overall control/arithmetic unit 1009 drives the lens 1002 to check whether or not an in-focus state is attained. If it is determined that an in-focus state is not attained, the overall control/arithmetic unit 1009 drives the lens 1002 again to calculate a distance.

After an in-focus state is confirmed, main exposure is started. Upon completion of exposure, an image sensing signal output from the solid-state image sensor 1004 undergoes correction and the like in the image sensing signal processing circuit 1005, is A/D-converted by the A/D converter 1006, and is processed by the signal processor 1007. Image data processed by the signal processor 1007 is stored in the memory unit 1010 by the overall control/arithmetic unit 1009.

After that, the image data stored in the memory unit 1010 is recorded in the recording medium 1012 via the recording medium control I/F under the control of the overall control/arithmetic unit 1009. Also, the image data can be provided to and processed by a computer via the external I/F unit 1013.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A photoelectric conversion device comprising:
   a p-type storage region;
   an n-type buried semiconductor region formed under the p-type storage region, the p-type storage region and the buried layer forming a photodiode;
   a floating diffusion;
   a transfer transistor configured to transfer holes accumulated in the p-type storage region to the floating diffusion;
   an amplifier transistor configured to amplify a signal which appears in the floating diffusion;
   an element isolation region;
   a channel stop region which is an n-type region and covers at least a lower portion of the element isolation region;
   an n-type semiconductor region arranged between the channel stop region and the n-type buried layer,
   wherein the element isolation region includes first element isolation portions arranged adjacent to a first semiconductor region to sandwich the first semiconductor region, the first semiconductor region being a region including, at its surface, an active region of the amplifier transistor,
   wherein the n-type semiconductor region includes a portion having an upper face contacting the channel stop region and the first semiconductor region, and a lower face contacting the n-type buried layer.

2. The device according to claim 1, further comprising a reset transistor which resets a potential of the floating diffusion region, wherein a channel width of the amplifier transistor is larger than a channel width of the reset transistor.

3. The device according to claim 1, further comprising a reset transistor which resets a potential of the floating diffusion region, wherein the amplifier transistor has a buried channel structure, and the reset transistor has a surface channel structure.

4. The device according to claim 1, further comprising: an n-type surface region arranged on the p-type storage region,
   wherein a dominant impurity of the surface region is the same as a dominant impurity of the channel stop region, and
   wherein a diffusion coefficient of the dominant impurity of the surface region is smaller than a diffusion coefficient of a dominant impurity of the buried semiconductor region.

5. The device according to claim 1, wherein the photoelectric conversion device is formed as a back-side illumination type photoelectric conversion device.

6. A camera comprising:
   a photoelectric conversion device according to claim 1; and
   a signal processor which processes a signal obtained by said photoelectric conversion device.

7. The device according to claim 1, further comprising a p-type semiconductor substrate, wherein the n-type buried semiconductor region is arranged on the p-type semiconductor substrate.

8. A photoelectric conversion device comprising:
   a p-type storage region;
   an n-type buried semiconductor region formed under said p-type storage region, said p-type storage region and said buried semiconductor region forming a photodiode, a dominant impurity of said buried semiconductor region being phosphorus;
   an element isolation region;
   a channel stop region which is an n-type region and covers at least a lower portion of said element isolation region, a dominant impurity of said channel stop region being arsenic;
   an n-type semiconductor region arranged between the channel stop region and the n-type buried layer;
   a p-type second semiconductor region, at least a portion of said p-type second semiconductor region being arranged between said p-type storage region and said n-type buried semiconductor region, an impurity concentration of said p-type storage region being higher than an impurity concentration of said p-type second semiconductor region; and
   a plurality of n-type barrier regions arranged at different depths from each other, and between said channel stop region and said n-type buried semiconductor region,
   wherein an upper one of said plurality of n-type barrier regions includes an impurity that is also included in said channel stop region, and
   a lower one of said plurality of n-type barrier regions includes an impurity that is also included in said n-type buried semiconductor region.

* * * * *